United States Patent [19]
Lockwood et al.

[11] 4,094,008
[45] June 6, 1978

[54] ALTERABLE CAPACITOR MEMORY ARRAY

[75] Inventors: George C. Lockwood, Dayton; Nicholas E. Aneshansley, Centerville, both of Ohio

[73] Assignee: NCR Corporation, Dayton, Ohio

[21] Appl. No.: 697,602

[22] Filed: Jun. 18, 1976

[51] Int. Cl.² .................. G11C 11/24; G11C 11/40
[52] U.S. Cl. ............................... 365/149; 365/184; 357/23
[58] Field of Search ............... 340/173 R, 173 CA; 357/23

[56] References Cited

U.S. PATENT DOCUMENTS

| 3,771,148 | 11/1973 | Aneshansley | 340/173 R |
| 3,911,464 | 10/1975 | Chang et al. | 340/173 CA |
| 3,916,390 | 10/1975 | Chang et al. | 340/173 R |

OTHER PUBLICATIONS

Kuo et al., 16-K RAM Built With Proven Process May Offer High Start-up Reliability, Electronics, 5/13/76, pp. 81-86.

Primary Examiner—Stuart N. Hecker
Attorney, Agent, or Firm—J. T. Cavender; Lowell C. Bergstedt

[57] ABSTRACT

A novel memory array is disclosed, the array utilizing a matrix of variable threshold insulated gate field effect transistor cells. The cells are comprised solely of a gate region, having nitride and oxide layers, and a source region with the output data sensed, at the source, as a change of source charge as distinguished from the prior art sensing of a change of low impedance source voltage. In operation, each cell functions as an alterable capacitor. A negative pulse applied to the gate selects the cell. Variations in stored charge at the nitride-oxide interface causes changes in the threshold voltage and effective capacitance of the cell. The source charge may then be sensed to read the stored data.

3 Claims, 2 Drawing Figures

ALTERABLE CAPACITOR MEMORY ARRAY

BACKGROUND OF THE INVENTION

1. Field of the Invention

This invention relates to memory cells and more particularly to an array of cells the output of which is detected as a quantity of charge as distinguished from detecting a steady current flow.

2. Description of the Prior Art

Nonvolatile variable threshold memory cells, which possess the properties of being capable of having the conductive threshold of the surface of the semiconductor body altered has been amply described in the prior art. In addition, the prior art has also described various semiconductor materials that exhibit the ability of being able to have its conduction varied between a high and low threshold condition and thus, represent binary information. However, until recently, the prior art has been restricted to the use of separate source and drain lines and the use of detection devices for detecting current flow between the source and drain to indicate the presence of a high or low threshold condition.

However, it is important in the design of integrated circuit memory devices, whether they be electrically alterable or not, that large numbers of bits be utilized in order to achieve the largest capacity possible on a given size chip. Accordingly, it is prime consideration of the design engineer to maximize the number of bits of the basic memory cells per chip, consistent with high reliability. Along these lines, other attempts have been made to maximize the number of bits that can be manufactured on a given chip by utilizing a common drain line for adjacent columns of transistors. While this reduces cell size, the space occupied by the drain connection is still an appreciable fraction of the total cell area.

SUMMARY OF THE INVENTION

A novel read only integrated circuit memory array is provided utilizing a matrix of variable threshold insulated gate field effect transistor cells wherein the individual cells are comprised of a single source region adjacent a variable threshold MNOS gate region. As distinguished from the prior art, the output data is sensed at the source as a change of source charge. Erasing all information appearing on the matrix is done by applying −20 volt signal to the substrate while applying a 0 volt signal to the gates of the cells. Writing information into any cell is accomplished by applying a −20 volt signal to the gates in a selected row and applying an appropriate signal to the source region in the selected column while reading is achieved by providing an enabling signal to the common gates in the selected row and detecting the charge appearing on the selected column.

In one embodiment a reference column is provided which generates a reference voltage and in another embodiment a reference voltage is provided. In each embodiment the reference voltage is approximately midway between the charge levels of a detected "0" and "1".

It is, therefore, a principal object of the subject invention to provide an array of variable threshold gate-source memory cells wherein the stored charge, at the nitride-oxide interface is sensed as a change of source charge.

Another principal object of the subject invention is to provide an array of variable threshold gate-source memory cells wherein the stored charge, at the nitride-oxide interface is sensed as a change of source charge and having a higher packing density than herebefore possible.

The features of my invention which I believe to be novel are set forth, with particularity, in the appended claims. My invention itself, however, both as to its organization and method of operation, together with further objects and advantages thereof, may best be understood by reference to the following description taken in conjunction with the accompanying drawings.

DESCRIPTION OF THE PREFERRED EMBODIMENTS

Figure 1:
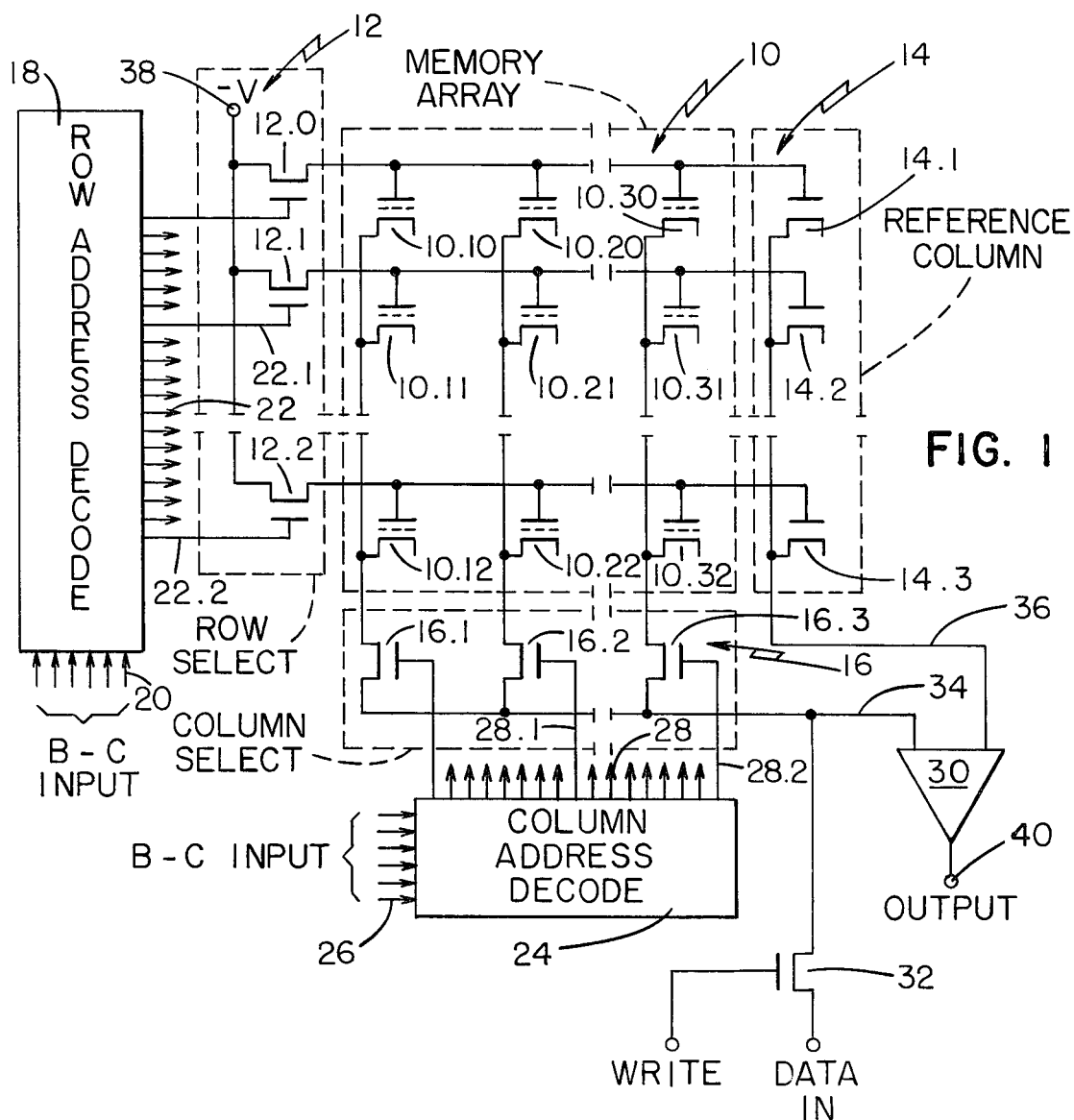
FIG. 1 is a circuit diagram of one embodiment of my novel array utilizing a reference column as a source of reference voltage.

Referring now to FIG. 1, there is shown a circuit diagram of my novel memory array 10 having an associated row select 12 and row address decode circuit 18 for providing enabling signals to the gates of the memory devices. Column select 16 and column address decode 24 are connected to the common source lines and the detected signal is applied as one input to sense amplifier 30, the reference voltage from reference column 14 is applied as the other input thereto.

In this embodiment, the foregoing operation will be described in the various modes, namely "erase", "write" and "read". Additionally, while the foregoing exegesis of the following embodiments will be directed toward a P-channel gate-source alterable capacitor, it should be obvious, to those skilled in the art, that the inventive concept may be used to construct an N-channel alterable capacitor.

Erase Mode

Since all cells 10.10 through 10.32 are constructed on the same substrate, it is a simple expedient to "erase" array 10, and, thereafter, set each of the individual memory cells to either a "0" or a "1". In this particular situation, a "0" is represented by a −3 volt threshold and a "1" is represented by a −10 volt threshold. "Threshold" being defined as that gate voltage which causes channel inversion and an increase in capacitance between gate and source. For example, to erase the entire chip and set each of the memory cells to "0" a −20 volt signal is applied to the substrate while simultaneously applying a "0" volt signal to the gates of cells 10.10 through 10.32.

Write Mode

To "write" or store a "1" (represented by a −10 volt threshold) into my novel device, a −20 volt signal is applied to the −V input terminal 38 of row select device 12 while appropriate binary coded signals are applied to input lines 20 of row address decode 18 and input lines 26 of column address decode 24. Since a "1", for purposes of this example, is desired to be written into device 10.21, the binary coded input applied to input lines 20 will have been chosen so as to provide an enabling signal on line 22.1 which is connected to the gate of transistor 12.1. This enabling output signal causes transistor 12.1 to become conductive thereby applying the −V voltage (−20 volts) from terminal 38 to the gates of transistors 10.11, 10.21 and 10.31 through the source and drain of transistor 12.1. Simultaneously with the application of −20 volts at terminal 38 to the gates of the memory cells in the selected row, a binary coded input is supplied to lines 26 of column address decode 24 so as to provide an enabling output on line 28.1, which line is connected to the gate of transistor 16.2 in column select 16. A write signal, similar in polarity and times to appear at the same time as the −V signal, is applied to the gate of write transistor 32 causing this transistor to become conductive. Since it is desired to write a "1" into cell 10.21, the source of transistor 32 is maintained at ground potential and, thus a 0 volt potential is applied to the source of transistor 10.21. Since −20 volts is being applied to the gate of transistor 10.21 while 0 volts is applied to the source, the threshold voltage of this transistor will become set at −10 volts due to the physical dimensions of the cell as well as the charge tunneling phenomena associated with MNOS devices in general.

It should be obvious that while −20 volts is applied at terminal 38, to the common source line of the transistors in row select 12, the −20 volts will only be applied to transistors 10.11, 10.21 and 10.31 by reason of the enabling signal on line 22.1 which causes transistor 12.1 to be the only device conducting in row select 12. Similarly, by reason of the enabling signal applied on line 28.1, transistor 16.2 will be the only conducting transistor in column select 16. Thus, only memory transistor 10.21 will be "written" to a −10 volt threshold (representing a "1") since it is the only device in array 10 having a "10" volt signal applied to its source and a −20 volt signal applied at its gate. The signals may then be removed and a "1" is stored in cell 10.21.

Read Mode

When it is desired to "read" a charge stored on a particular cell (assuming, by way of example, it is desired to read the charge on cell 10.32) a −10 volt signal is applied to the −V terminal 38 in row select 12 which terminal is connected to the common source line of transistors 12.0, 12.1 and 12.2. Since the coordinates of cell 10.32 are known, an appropriate binary coded information signal is applied as an input to lines 20 of row address decode 18 in order to produce an enabling signal solely on line 22.2 to the exclusion of all the other output lines. This enabling signal causes only transistor 12.2 to become conductive thereby applying the −10 volts appearing at terminal 38 to the gates of transistors 10.12, 10.22 and 10.32. While the binary coded row address information is selecting line 22.2, to the exclusion of all the others, an appropriate binary coded information signal is simultaneously being applied in input lines 26 of column address decode 24 in order to place a column enabling signal on line 28.2 thus causing only transistor 16.3, in column select 16, to become conductive. Thus, since only transistor 12.2 in row select 12 and transistor 16.3 in column select 16 are the only conductive transistors, the threshold voltage of cell 10.32 will determine its gate-source capacitance and the amount of charge which will become manifest on line 34 after having been conducted through the drain-source region of transistor 16.3. This charge is then applied, via line 34, as one input to sense amplifier 30.

It should be noted that when an enabling signal appears on line 22.2, to drive transistor 12.2 into conduction, the −10 volts appearing at terminal 38 of row select 12 is also applied to the gate of transistor 14.3 in reference column 14.

A fixed gate to source capacitance is also present in the particular row transistor in reference column 14 and a charge appears on line 36 as a −2 volt signal and applied as the other input to sense amplifier 30. All transistors 14.1, 14.2 and 14.3 in reference column 14 are MOS devices and, by reason of the specific dimensions thereof will always produce a −2 volt signal as the second input to sense amplifier 30.

Thus, when the alterable threshold of the memory device being read is charged toward its positive limit (−3 volts or "0"), a larger gate to source capacitance will be present and a larger negative charge will appear on the common source line 34 to be applied to sense amplifier 30 as one input. This signal is then compared, in amplifier 30, with the −2 volt signal on line 36 to produce an output which will be negative. When the alterable threshold of the memory device is charged towards its negative limit (−10 volts or "1"), a smaller negative charge will be coupled into line 34, and the output of sense amplifier 30 will be positive to indicate the presence of a "1" at cell 10.32.

Figure 2:
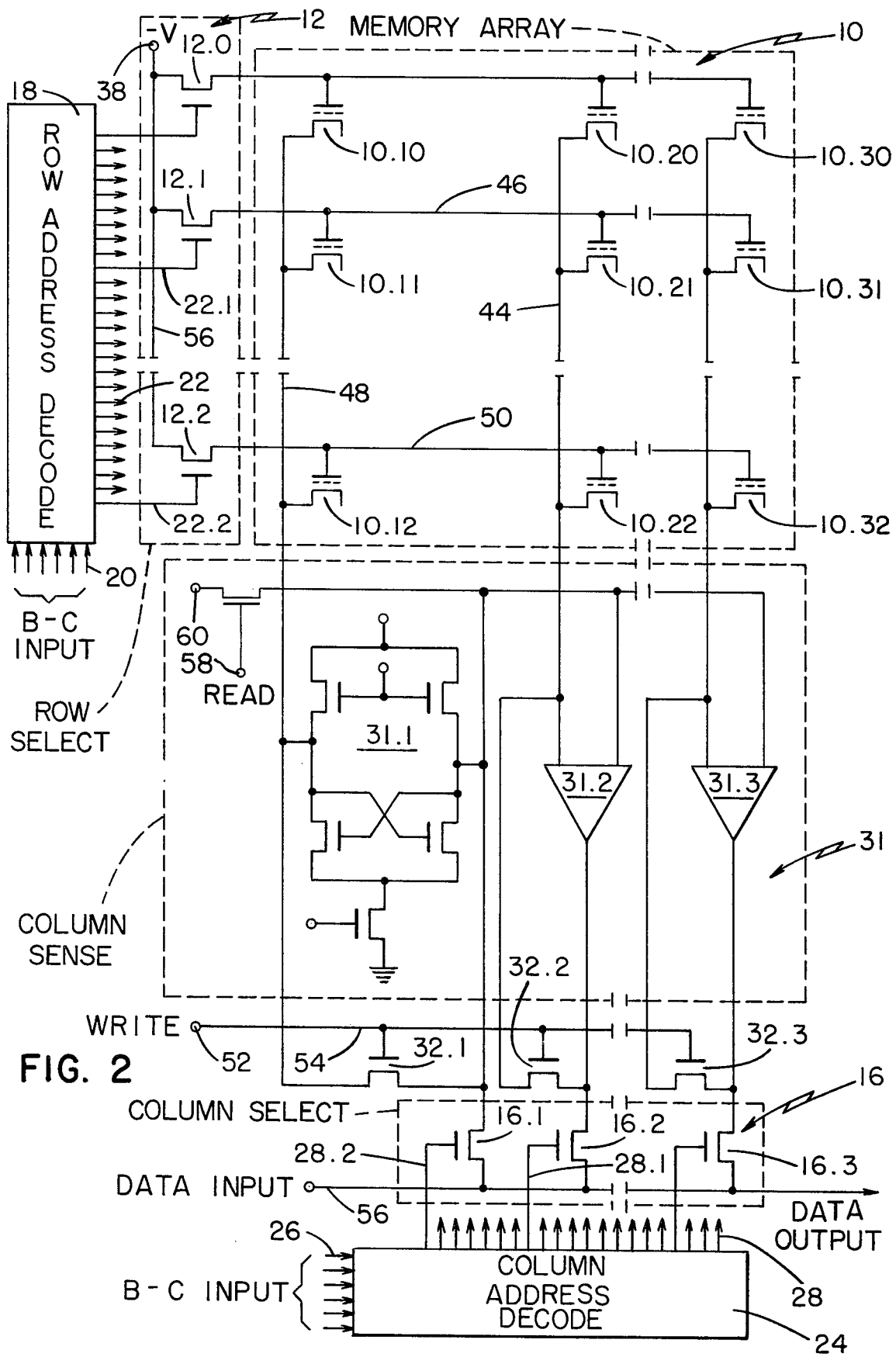
FIG. 2 is a circuit diagram of a second embodiment of my novel array utilizing a reference voltage and separate write transistors for each column.

Reference is now made to FIG. 2 for a description of another embodiment of my novel array. In this embodiment, common elements will be similarly numbered and its operation will be described in the various modes, namely "erase", "write" and "read".

Erase Mode

As in the embodiment of FIG. 1 all cells 10.10 through 10.32 are constructed on the same substrate. Accordingly the same procedure is utilized to "erase" array 10, and, thereafter, set each of the individual memory cells to either a "0" or a "1". As before, a binary "0" will be represented by a −3 volt threshold and a "1" will be represented by a −10 volt threshold. "Threshold" being defined as that gate voltage which causes channel inversion and an increase in capacitance between gate and source. For example, to erase the entire chip and set each of the memory cells to "0", a −20 volt signal is applied to the substrate while simultaneously applying a "0" volt signal to the gates of cells 10.10 through 10.32.

Write Mode

To "write" or store a "1" (represented by a −10 volt threshold) into my novel device of FIG. 2, a −20 volt signal is applied to the −V input terminal 38 of row select device 12 while appropriate binary coded signals are applied to input lines 20 of row address decode 18 and input lines 26 of column address decode 24. Since it is desired to write a "1" into memory cell 10.21, the binary coded input applied to input lines 20 will have been chosen so as to provide an enabling signal on line 22.1 which is connected to the gate of transistor 12.1. This enabling output signal causes transistor 12.1 to become conductive thereby applying the −V voltage (−20 volts) from terminal 38 to the common gate line 46 for transistors 10.11, 10.21 and 10.31 through the source and drain of transistor 12.1. Simultaneously with the application of −20 volts at terminal 38 to gate line 46 for the memory cells in the selected row, a binary coded input is supplied to lines 26 of column address decode 24 so as to provide an enabling output on line 28.1, which line is connected to the gate of transistor 16.2 in column select 16. A write signal, similar in polarity and times to appear at the same time as the −V signal, is applied at terminal 52 to common gate line 54 for transistors 32.1, 32.2 and 32.3. However, only transistor 32.3 has been rendered conductive by an enabling signal and since it is desired to write a "1" into cell 10.21, the source of transistor 16.2 is maintained at ground potential by the signal on data input line 56. Thus, with both transistors 16.2 and 32.2 being conductive a 0 volt potential is applied to the source of transistor 10.21. Since −20 volts is being applied to the gate of transistor 10.21 while 0 volts is applied to the source, the threshold voltage of this transistor will become set at −10 volts due to the physical dimensions of the cell as well as the charge tunneling phenomena associated with MNOS devices in general.

It should be obvious that while −20 volts is applied at terminal 38, to common source line 56 of the transistors in row select 12, the −20 volts will only be applied to transistors 10.11, 10.21 and 10.31 by reason of the enabling signal on line 22.1 which causes transistor 12.1 to be the only device conducting in row select 12. Similarly, by reason of the enabling signal applied on line 28.1, transistor 16.2 will be the only conducting transistor in column select 16. Thus, only memory transistor 10.21 will be "written" to a −10 volt threshold (representing a "1") since it is the only device in array 10 having a "0" volt signal applied to its source and a −20 volt signal applied at its gate. The signals may then be removed and a "1" is stored in cell 10.21.

Read Mode

When it is desired to "read" the data stored in a particular cell (assuming, by way of example, it is desired to read the data on cell 10.12), a −10 volt signal is applied at terminal 38, to common source line 56 of transistor 12.0, 12.1 and 12.2 in row select 12. Since the coordinates of cell 10.12 are known, an appropriate binary coded information signal is applied as an input to lines 20 of row address decode 18 in order to produce an enabling signal solely on line 22.2 to the exclusion of all the other output lines. This enabling signal causes only transistor 12.2 to become conductive thereby applying the −10 volts appearing at terminal 38 to the gate of transistors 10.12, 10.22 and 10.32. While the binary coded row address information is selecting line 22.2, to the exclusion of all the others, another appropriate binary coded information signal is simultaneously being applied to input lines 26 of column address decode 24 in order to place a column enabling signal on line 28.2 thus causing only transistor 16.1 in column select 16, to become conductive.

Simultaneous with the application of binary coded input information applied to lines 20 and 26 to provide enabling signals on lines 22.2 and 28.2 respectively, a "read" signal is applied to terminal 58, connected to the gate of transistor 62 to drive this transistor into conduction. As soon as transistor 62 becomes conductive, the −2 volt reference voltage, applied at terminal 60, appears at one side of the one-shot multivibrator 31.1. Thus, when the alterable threshold of the memory device being read is charged toward its positive limit (−3 volts or "0") a relatively large negative charge will appear on common source line 48 and applied as one input to column sense amplifier 31.1. This signal is then compared, in sense amplifier 31.1, with the −2 volt reference signal from terminal 60 to produce a negative output indicative of a stored "0". Conversely, should the alterable threshold of the memory device being read be charged toward its negative limit (−10 volts or "1"), a relatively small negative charge will appear on common source line 48 and applied as one input to column sense amplifier 31.1. The comparison of this signal, is amplifier 31.1, with the −2 volt reference signal produces a positive output indicative of a stored "1".

While an example of a one-shot multivibrator sense amplifier is shown at 31.1 of FIG. 2, it is merely illustrative of one circuit capable of producing an output indicative of the stored charge. Other circuits should now be obvious to those skilled artisans. Further, although no specific circuit has been shown for sense amplifier 30 of FIG. 1, it will be obvious that either sense amplifier 31.1 of FIG. 2 may be used, or any other similar device may be substituted, provided its output is compatible with the next following stage.

What is claimed is:

1. A non-volatile semiconductor memory system comprising:

a rectangular array of non-volatile, alterable threshold capacitors disposed on a single semiconductor substrate and comprising a plurality of parallel source stripes formed in the substrate, and a plurality of non-volatile, alterable-threshold capacitor devices formed on said substrate in a plurality of columns each immediately adjacent one of said source stripes, each of said capacitor devices comprising dual gate insulator layers of thin silicon oxide and silicon nitride and a conductive gate element connected in common along each common gate row of said capacitor devices, and each of said capacitor devices being selectably preprogrammed to one of first and second threshold voltage states having associated first lower and second higher capacitance values by application of selected signals to substrate, source stripe and gate element; and reading means comprising read signal means for applying a read voltage to a selected row of said capacitor devices, reference signal means for supplying a reference signal voltage, at least one differential sensing circuit receiving said reference signal voltage, and coupling means for operatively coupling said differential sensing circuit between a selected one of said source stripes and an output terminal, said read voltage having a magnitude at least equal to said second threshold voltage to couple a charge of first or second magnitude to said source stripe depending on whether the capacitor device associated with said selected row and selected source stripe is in said first or second threshold voltage state, said differential sensing circuit comparing the voltage induced on said selected source stripe by said charge with said reference voltage to produce an output of a first value if said induced voltage is greater than said reference voltage and a second value if said induced voltage is less than said reference voltage.

2. The system as claimed in claim 1, wherein said reference signal means comprises a plurality of reference, nonalterable capacitor devices arranged in a column on said substrate adjacent one of said source stripes and having gate electrodes connected to said common gate rows; said read signal means comprises a row address decode circuit responsive to a set of binary coded row address signals to produce an output row select signal and a row select circuit responsive to said row select signal to couple said read voltage to a selected common gate row; and said coupling means comprises a column address decode circuit responsive to a set of binary coded column address signals to produce an output column select signal and a column select circuit responsive to said column select signal to couple a selected one of said source stripes to a single differential sensing circuit connected to said output terminal.

3. The system as claimed in claim 1, wherein said reference signal means comprises a reference D.C. voltage, a plurality of differential sensing circuits coupled to said reference D.C. voltage and individually to said source stripes; said read signal means comprises a row address decode circuit responsive to a set of binary coded row address signals to produce an output row select signal and a row select circuit responsive to said row select signal to couple said read voltage to a selected common gate row; and said coupling means comprises a column address decode circuit responsive to a set of binary coded column address signals to produce an output column select signal and a column select circuit responsive to said column select signal to couple a selected one of said differential sensing circuits to said output terminal.

* * * * *